United States Patent
Tomari

(10) Patent No.: US 6,373,326 B1
(45) Date of Patent: Apr. 16, 2002

(54) WRITING CIRCUIT

(75) Inventor: Nobuhiro Tomari, Miyazaki (JP)

(73) Assignee: Oki Electric Industry Co, Ltd., Tokyo (JP)

( * ) Notice: Subject to any disclaimer, the term of this patent is extended or adjusted under 35 U.S.C. 154(b) by 0 days.

(21) Appl. No.: 09/591,339

(22) Filed: Jun. 9, 2000

(30) Foreign Application Priority Data

Jun. 11, 1999 (JP) ............................................. 11-165214

(51) Int. Cl.[7] .............................. G05F 1/10; G05F 3/02
(52) U.S. Cl. ..................................................... 327/536
(58) Field of Search ............................. 327/53 H, 535, 327/536, 537

(56) References Cited

U.S. PATENT DOCUMENTS 5,640,118 A * 6/1997 Drouot ........................ 327/306

* cited by examiner

Primary Examiner—Toan Tran
Assistant Examiner—Quan Tra
(74) Attorney, Agent, or Firm—Rabin & Berdo, P.C.

(57) ABSTRACT

A charge pump circuit 203 boosts a power supply voltage to generate a high voltage VPP in response to clocks CK, CK/ supplied from an oscillation circuit 202. A voltage detecting circuit 205 discriminates whether the high voltage VPP reaches a desired voltage value or not and represents it by discrimination signals LVPP, DIS/. If the high voltage VPP does not reach the desired voltage value, a writing control circuit 201 stops the oscillation circuit 202 from effecting its oscillating operation and stops the charge pump circuit 203 from boosting the power supply voltage to the high voltage VPP in response to the discrimination signal DIS/. Accordingly, the high voltage VPP having a desired voltage value is not applied to a memory cell of a memory circuit 204 so that writing is not effected. Further, the discrimination signal LVPP, is outputted externally so as to represent the writing state in the memory cell.

1 Claim, 10 Drawing Sheets

WRITING CIRCUIT

BACKGROUND OF THE INVENTION

1. Field of the Invention

The invention relates to a writing circuit, particularly to a writing circuit provided in a semiconductor memory device.

This application is a counterpart of Japanese patent application, Serial No. 165214/1999, filed Jun. 11, 1999, the subject matter of which is incorporated herein by reference.

2. Description of the Related Art

FIG. 1 shows a circuit configuration of a nonvolatile memory device having a conventional writing circuit, wherein the nonvolatile memory device comprises a writing circuit 100 and a memory circuit 104. The writing circuit 100 comprises a writing control circuit 101, an oscillation circuit 102 connected to the output side of the writing control circuit 101, and a charge pump circuit 103 connected to the output side of the oscillation circuit 102. The writing circuit 100 controls the writing operation in the memory circuit 104 using a high voltage VPP generated in the charge pump circuit 103. The writing control circuit 101 supplies an oscillation instruction signal START representing the start of oscillation to the oscillation circuit 102. The oscillation circuit 102 supplies a clock CK and an inverted clock CK/ to the charge pump circuit 103. The charge pump circuit 103 generates the high voltage VPP and supplies the high voltage VPP to the memory circuit 104.

Described hereinafter is a case where the writing circuit 100 writes data in the memory circuit 104. The writing control circuit 101 renders the oscillation instruction signal START representing the start of oscillation, namely, "H" (i.e., High). The oscillation circuit 102 oscillates in response to the oscillation instruction signal START so as to generate the clocks CK, CK/, e.g., of 5 MHz, and the two clocks CK, CK/ are supplied to the charge pump circuit 103. The charge pump circuit 103 boosts a power supply voltage in response to the two clocks CK, CK/ so as to generate the high voltage VPP. If the memory circuit 104 is composed of, e.g., a nonvolatile memory such as an EEPROM, the thus generated high voltage VPP is about 20 volts. The memory circuit 104 writes and stores data therein upon reception of the high voltage VPP. If the memory circuit 104 is composed of the EEPROM, it stores data therein by causing tunneling in an internal memory cell thereof. The thus supplied high voltage VPP is required to have a voltage value not less than a given value (threshold voltage) so that the memory circuit 104 stores data therein. Whereupon, if the high voltage VPP is not more than the threshold voltage (15 volts), the tunneling does not occur so that data is not stored in the EEPROM, i.e., memory circuit 104.

However, the conventional writing circuit has the following problems.

In the conventional writing circuit, the high voltage VPP generated in the charge pump circuit 103 is not determined. Accordingly, the verification whether a writing operation is effected properly or not is performed by confirming data upon completion of the writing operation.

Further, if the high voltage VPP is unstable (in cases where a voltage is close to threshold voltage), the writing operation is effected or not effected in some cases. Accordingly, there is a possibility that the data written in the memory circuit 104 is corrupted to the extent that it cannot be recovered.

SUMMARY OF THE INVENTION

It is an object of the invention to provide a writing circuit in a semiconductor memory device.

Another object of the invention is to provide a voltage detecting circuit in a writing circuit.

To achieve the above object, charge pump circuit 203 boosts a power supply voltage to generate a high voltage VPP in response to clocks CK, CK/ supplied from an oscillation circuit 202. A voltage detecting circuit 205 discriminates whether the high voltage VPP reaches a desired voltage value or not and represents it by discrimination signals LVPP, DIS/. If the high voltage VPP does not reach the desired voltage value, a writing control circuit 201 stops the oscillation circuit 202 from effecting its oscillating operation and stops the charge pump circuit 203 from boosting the power supply voltage to the high voltage VPP in response to the discrimination signal DIS/. Accordingly, the high voltage VPP having a desired voltage value is not applied to a memory cell of a memory circuit 204 so that writing is not effected. Further, the discrimination signal LVPP is outputted externally so as to represent the writing state in the memory cell.

BREIF DESCRIPTION OF THE DRAWINGS

DETAILED DESCRIPTION OF THE PREFERRED EMBODIMENTS

First Preferred Embodiment (FIGS. 2 to 9)

This invention will be described in further detail by way of example with reference to the accompanying drawings.

Figure 2:
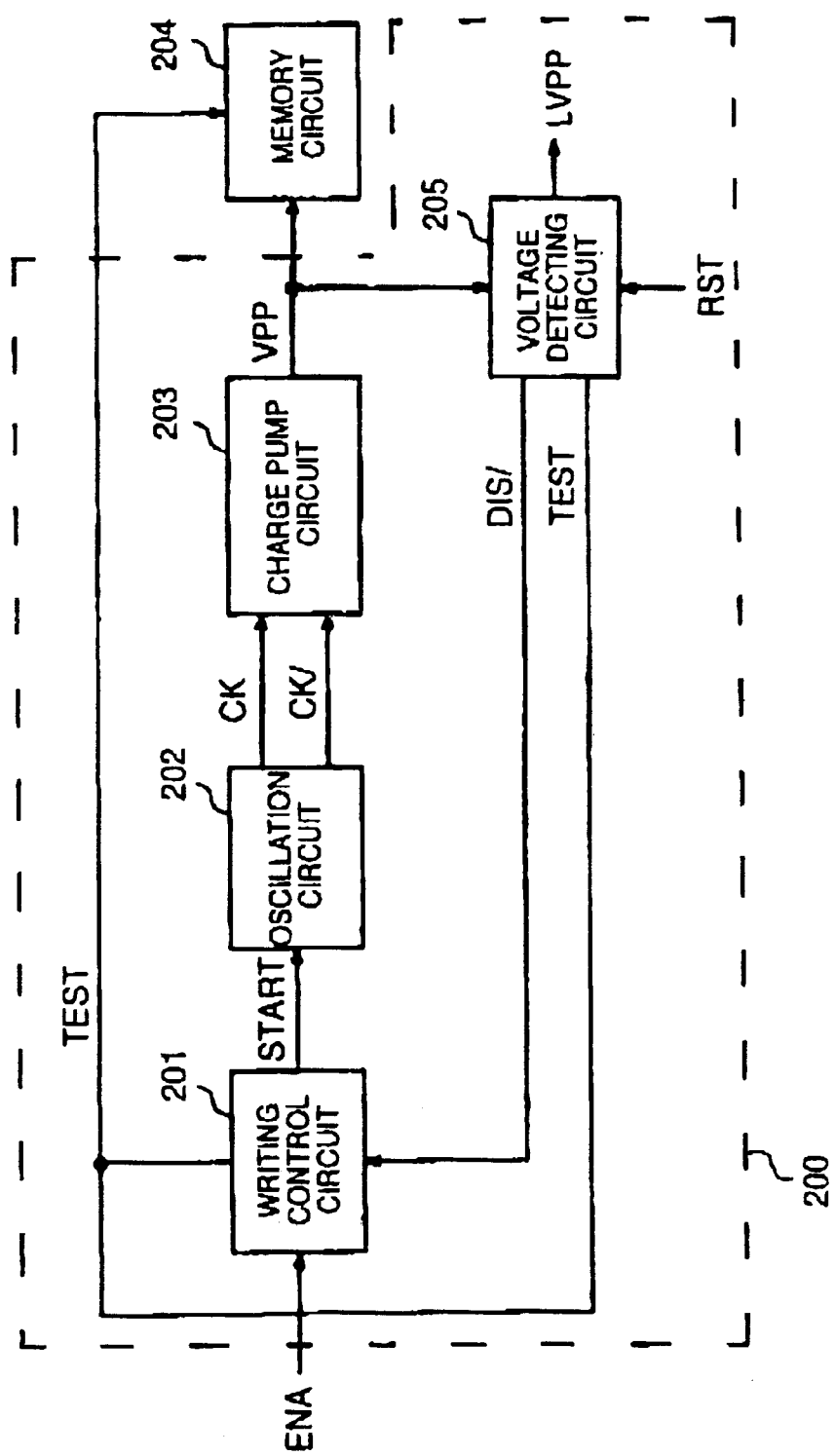
FIG. 2 is a block diagram of a semiconductor memory device having a writing circuit according to a first preferred embodiment of the invention.

FIG. 2 is a block diagram of a semiconductor memory device having a writing circuit according to a first preferred embodiment of the invention. The semiconductor memory device comprises a writing circuit 200 and a memory circuit 204. The writing circuit 200 comprises a writing control circuit 201, an oscillation circuit 202 connected to the output side of the writing control circuit 201, and a charge pump circuit 203 connected to the output side of the oscillation circuit 202, and a voltage detecting circuit 205 connected to the output side of the charge pump circuit 203. The memory circuit 204 has a memory cell 601 and stores data in the memory cell 601 upon reception of a high voltage VPP outputted from the charge pump circuit 203.

The structure and function of each circuit of the semiconductor memory device are hereinafter described with reference to FIGS. 3 to 9.

Figure 1:
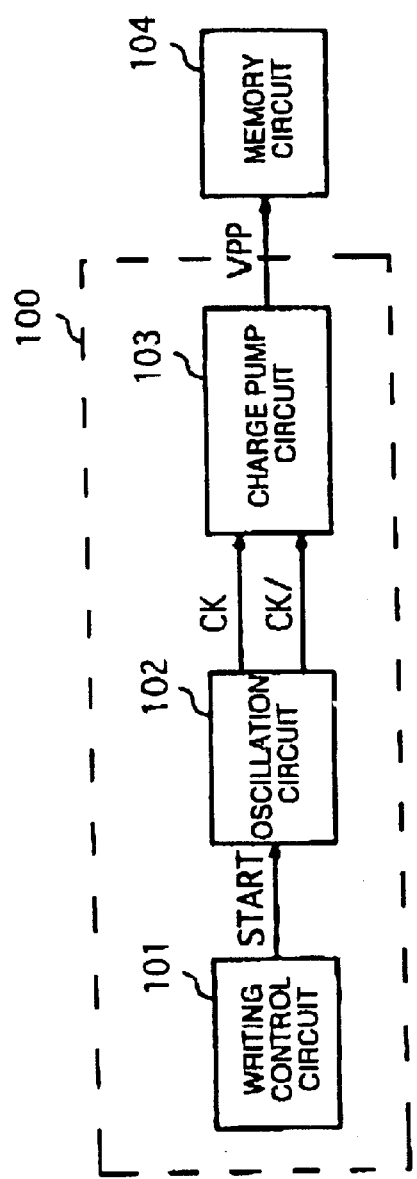
FIG. 1 is a block diagram of a conventional semiconductor memory device.
Figure 3:
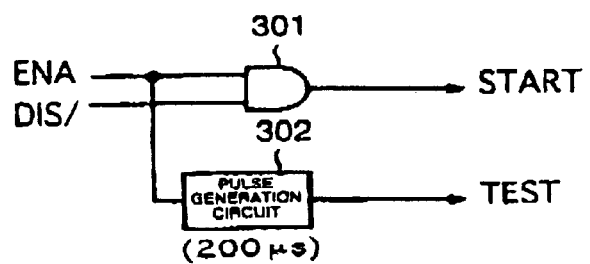
FIG. 3 is a circuit diagram of a writing control circuit 201 shown in FIG. 2.
Figure 4:
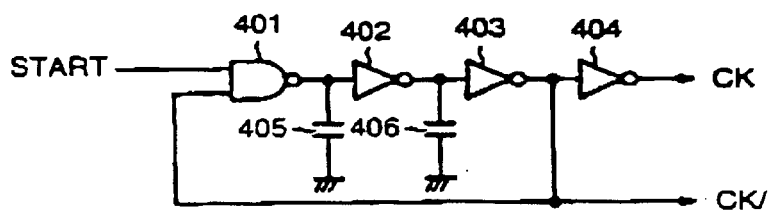
FIG. 4 is a circuit diagram of an oscillation circuit 202 shown in FIG. 2.
Figure 5:
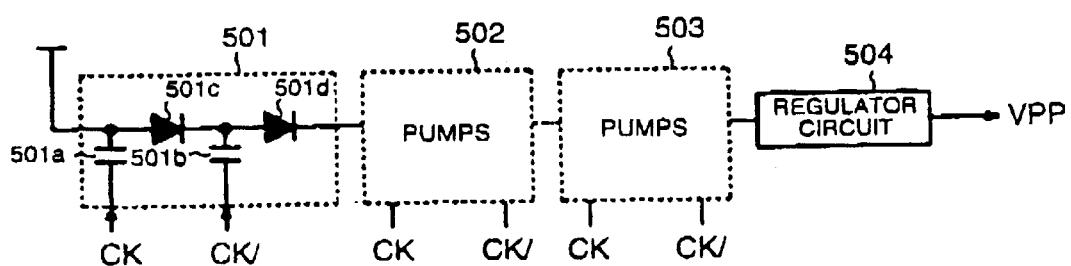
FIG. 5 is a circuit diagram of a charge pump circuit 203 shown in FIG. 2.
Figure 6:
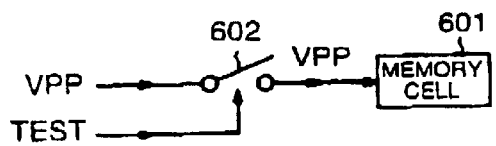
FIG. 6 is a circuit diagram of a memory circuit 204 shown in FIG. 2.
Figure 7:
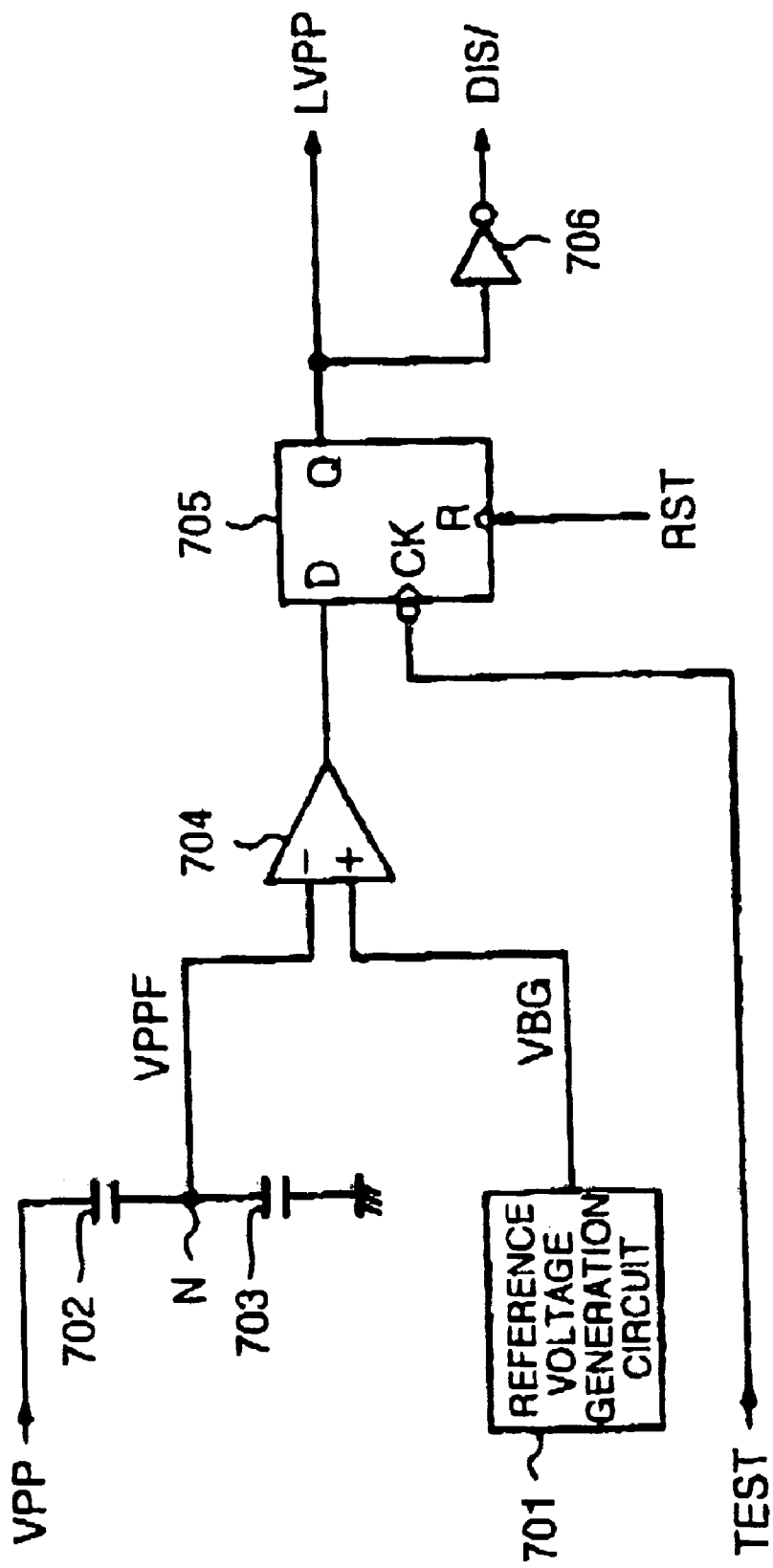
FIG. 7 is a circuit diagram of a voltage detecting circuit 205 shown in FIG. 2.

FIG. 3 is the circuit diagram showing an example of the configuration of the writing control circuit 201 shown in FIG. 2. FIG. 4 is a circuit diagram showing an example of the configuration of the oscillation circuit 202 shown in FIG. 2. FIG. 5 is a circuit diagram showing an example of the configuration of the charge pump circuit 203 shown in FIG. 2. FIG. 6 is a circuit diagram showing an example of the configuration of a memory circuit 204 shown in FIG. 2. FIG. 7 is a circuit diagram showing an example of the configuration of the voltage detecting circuit 205 shown in FIG. 2.

The writing control circuit 201 comprises, as shown in FIG. 3, an AND gate 301 for receiving a start signal ENA representing the start of writing and a discrimination signal DIS/ that is one of discrimination signals and represents the high voltage VPP, described later, as being normal or abnormal, and a pulse generation circuit 302 that receives the start signal ENA and generates one a shot pulse when the start signal ENA becomes "H". In the writing control circuit 201, the AND gate 301 detects when the start signal ENA becomes "H" and renders the oscillation instruction signal START supplied to the oscillation circuit 202 valid, i.e., "H", representing the start of oscillation. However, when the discrimination signal DIS/ is "L" (i.e., Low), namely, when the high voltage VPP is abnormal, the AND gate 301 operates to render the oscillation instruction signal START "L" so as to stop the oscillating operation.

The pulse generation circuit 302 is triggered at the leading edge of the start signal ENA and generates one pulse period setting signal TEST which becomes "H" for a given period, e. g., 200 μs. The period setting signal TEST is a signal for setting a wait time until the high voltage VPP reaches a desired voltage value.

The oscillation circuit 202 has a two-input NAND gate 401 for receiving the oscillation instruction signal START at one input terminal as shown in FIG. 4. Three stage inverters 402, 403, 404 are serially connected to the output side of the two-input NAND gate 401 while the output of the inverter 403 is fed back and connected to the other input terminal of the two-input NAND gate 401. A capacitor 405 is connected between the output terminal of the two-input NAND gate 401 and the ground for setting a delay time while a capacitor 406 is connected between the output terminal of the inverter 402 and the ground for setting a delay time.

In the oscillation circuit 202, when the oscillation instruction signal START becomes "H", the output of the two-input NAND gate 401 becomes "L". The output "L" is delayed in time by the capacitance of the capacitor 405 and is applied to the inverter 402 so that the output of the inverter 402 becomes "H". The output "H" is delayed in time by the capacitor 406 and is applied to the inverter 403 so that the output of the inverter 403 becomes "L". As a result, the output of the inverter 404 becomes "H" and the output of the two-input NAND gate 401 goes "H". Then the same operations are repeated and the oscillation circuit 202 effects an oscillating operation at a frequency at which the delay time involved in the circulation of the change of logical levels of the output, that is outputted from the output terminal of the two-input NAND gate 401 and returned to the input terminal thereof, is a half cycle. When the capacitances of the capacitors 405 and 406 are set, the oscillation frequency is also set. Thus, the oscillation circuit 202 outputs the clock CK from the inverter 404 when triggered at the "H" or leading edge of the oscillation instruction signal START, and outputs the inverted clock CK/ from the inverter 403.

The charge pump circuit 203 is a circuit for boosting a power supply voltage to generate the high voltage VPP and has pumps 501, 502, 503 which are serially connected to each other in plural stages, and a regulator circuit 504. Each of the pumps 501, 502, 503 has the same configuration. For example, the pump 501 comprises a capacitor 501a having one electrode to which the clock CK is inputted, a capacitor 501b having one electrode to which the inverted clock CK/ is inputted, a diode 501c having an anode connected to a power supply and a diode 501d having an anode connected to a cathode of the diode 501c. Another electrode of the capacitor 501a is connected to the anode of the diode 501c while another electrode of the capacitor 501b is connected to the anode of the capacitor 501d. The cathode of the diode 501d forms an output terminal of the pump 501.

The regulator circuit 504 is a circuit for limiting the outputted high voltage VPP to a desired voltage value when the voltage value of the high voltage VPP generated in the pumps 501, 502, 503 exceeds the desired voltage value. For example, the regulator circuit 504 comprises a plurality of Zenor diodes that are serially connected to each other to clamp the outputted voltage value to a desired voltage value.

In the charge pump circuit 203, when the clock CK becomes "H", the capacitor 501a of the pump 501 is charged, and the charged voltage is added to the power supply voltage, which becomes the output voltage of the diode 501c. When the inverted clock CK/ becomes "H", the capacitor 501b of the pump 501 is charged, and the charged voltage is added to the output voltage of the diode 501c, which becomes the output voltage of the diode 501d. When the similar boosting operation is effected by the pumps 502, 503, the high voltage VPP obtained by boosting the power supply voltage is generated.

The memory circuit 204 has a nonvolatile memory cell 601 such as an EEPROM. When the high voltage VPP generated in the charge pump circuit 203 is applied to the memory cell 601, the threshold value of the transistor of the memory cell 601 is changed to store data therein. The memory cell 601 shown in FIG. 6 has a configuration connected to a switch 602 through which the high voltage VPP is applied thereto. The function of switch 602 is to be OFF when the period setting signal TEST is "H", thereby stopping the application of the high voltage VPP to the memory cell 601 and to be ON when the period setting signal TEST is "L", thereby applying the high voltage VPP to the memory cell 601.

The voltage detecting circuit 205 comprises, as shown in FIG. 7, a reference voltage generation circuit 701 having, e.g., a band gap reference voltage generation source and capacitors 702, 703. The reference voltage generation circuit 701 generates a reference voltage VBG. The capacitors 702, 703 convert the high voltage VPP into a comparison voltage VPPF, and they are serially connected between the output terminal of the charge pump circuit 203 and the ground wherein the comparison voltage VPPF is outputted from a node N between the capacitors 702, 703. For example, if the capacitance ratio between the capacitors 702, 703 is 1:9, the comparison voltage VPPF becomes one tenth of the high voltage VPP. Even if the reference voltage VBG generated in the reference voltage generation circuit 701 is set to a low value, a voltage comparator circuit 704 can compare the reference voltage with the comparison voltage. For example, when the high voltage VPP is 20 volts, the comparison voltage VPPF becomes 2.0 volts, and hence even if the reference voltage VBG is set to a low value of about 1.2 volts, the comparison therebetween can be effected. The node N is connected to an inverted input terminal (−) of the voltage comparator circuit 704 having an operational amplifier. The output terminal of the reference voltage generation circuit 701 is connected to the non-inverted input terminal (+) of the voltage comparator circuit 704.

The output terminal of the voltage comparator circuit 704 is connected to a data input terminal D of a delay flip-flop (discrimination circuit) 705. The period setting signal TEST is inputted from the writing control circuit 201 to a clock terminal CK of the flip-flop 705 while a reset signal RST from an external device is inputted to a reset terminal R thereof. The flip-flop 705 latches the output signal of the voltage comparator circuit 704 and outputs it as a single discrimination signal LVPP. An inverter 706 is connected to a data output terminal Q of the flip-flop 705 through which a discrimination signal LVPP and the discrimination signal DIS/ that is the inverted signal of the discrimination signal LVPP are outputted.

The voltage comparator circuit 704 outputs an "L" signal when the comparison voltage VPPF is not less than the voltage level of the reference voltage VBG while it outputs an "H" signal in the opposite case. For example, when the reference voltage VBG is 1.2 volts, and the comparison voltage VPPF is not more than 1.2 volts, namely, when the high voltage VPP is not more than a desired voltage of 12 volts, the "H" signal is outputted.

The flip-flop 705 latches the output signal of the voltage comparator circuit 704 in synchronization with the trailing edge of the period setting signal TEST. If the comparison voltage VPPF is not more than the reference voltage VBG, the flip-flop 705 latches the "H" signal and outputs this "H" signal as the discrimination signal LVPP. Accordingly, when the discrimination signal LVPP is "H", it represents that the high voltage VPP has not reached a desired voltage value. At this time, the discrimination signal DIS/ outputted from the inverter 706 becomes "L". To the contrary, when the high voltage VPP reaches a desired voltage value, the discrimination signal LVPP becomes "L" and the discrimination signal DIS/ becomes "H".

Figure 8:
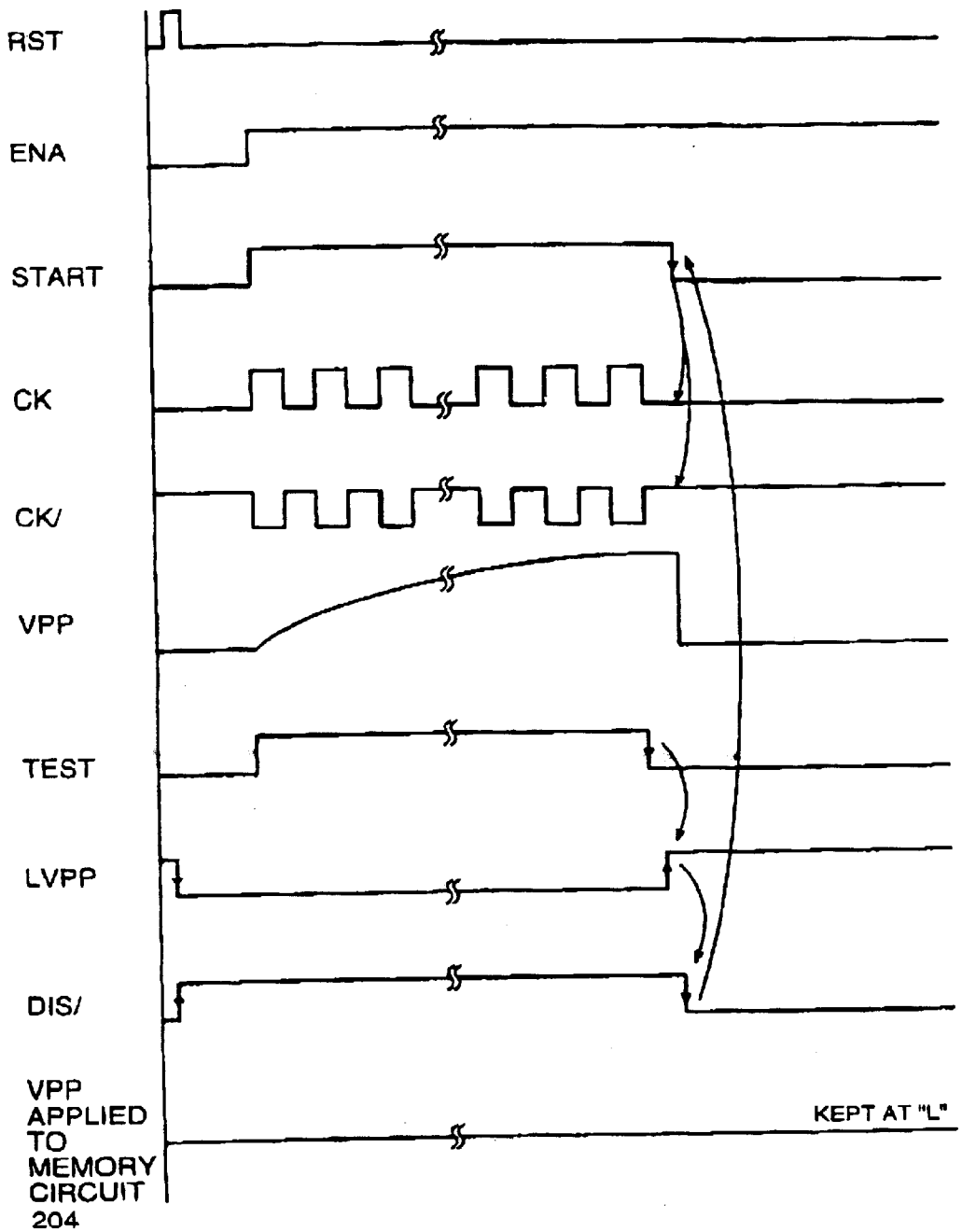
FIG. 8 is a timing chart showing the operation of the semiconductor memory device shown in FIG. 2 in cases where a high voltage VPP does not reach a desired voltage value.
Figure 9:
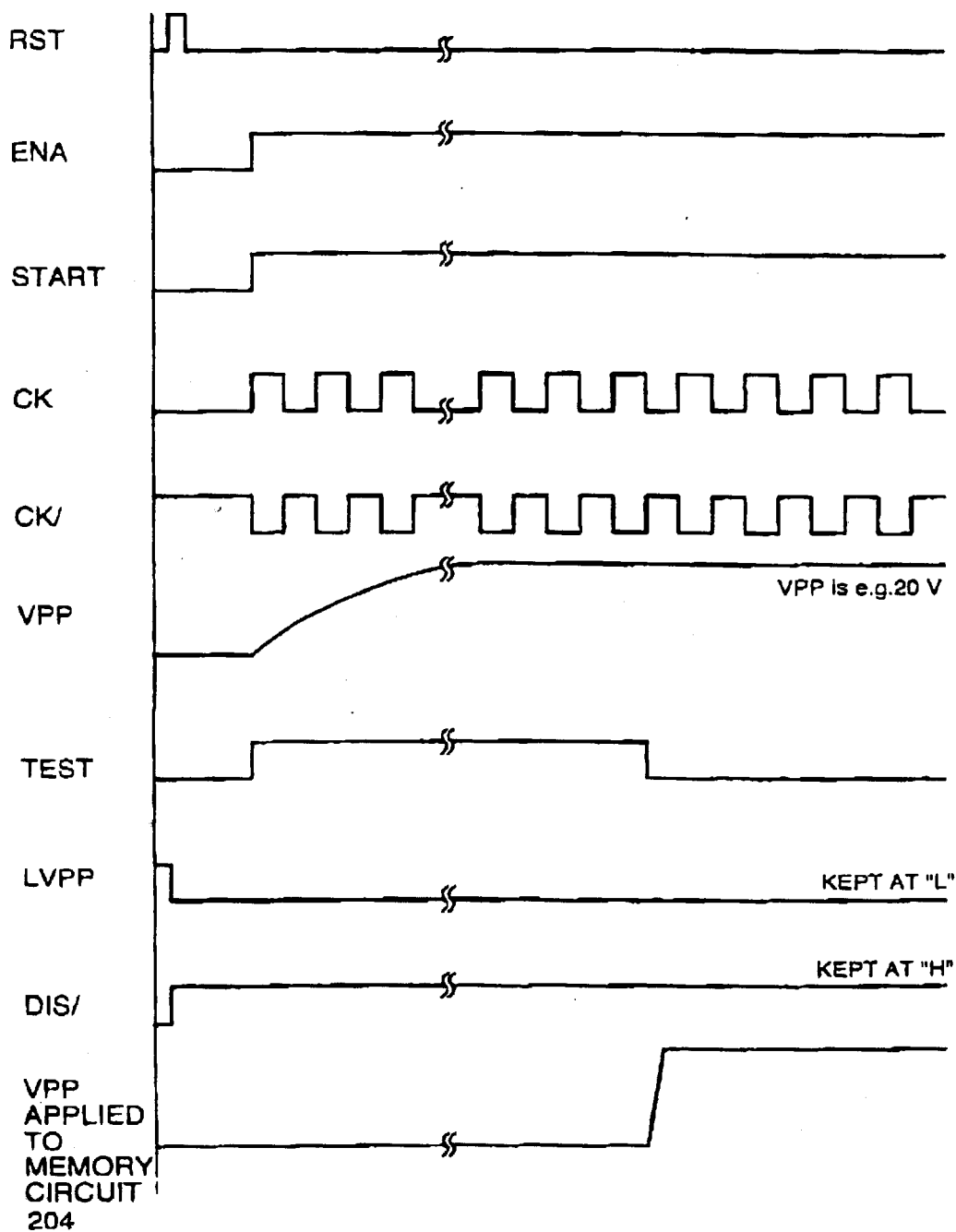
FIG. 9 is a timing chart showing the operation of the semiconductor memory device shown in FIG. 2 in cases where a high voltage VPP reaches the desired voltage value.

FIGS. 8 and 9 are timing charts showing the operation of semiconductor memory device having the writing circuit of the invention. The operation of the semiconductor memory device is now described with reference to FIGS. 8 and 9.

When the reset signal RST is supplied to the flip-flop 705 of the voltage detecting circuit 205 from the outside of the writing circuit 200, the flip-flop 705 effects a reset operation. That is, the flip-flop 705 forcibly renders the discrimination signal LVPP "L", and the discrimination signal DIS/ "H" regardless of the level state held so far. The flip-flop 705 supplies the discrimination signal LVPP to the outside of the writing circuit 200 and supplies the discrimination signal DIS/ to the writing control circuit 201.

At this time, when the start signal ENA representing the start of writing ("H" level) is supplied to the writing control circuit 201, the writing control circuit 201 renders the period setting signal TEST "H" for a given period (e.g., 200 µs) The writing control circuit 201 supplies the period setting signal TEST to the memory circuit 204 and voltage detecting circuit 205. The period setting signal TEST is a one pulse signal. The writing control circuit 201 renders the oscillation instruction signal START "H" and supplied it to the oscillation circuit 202 while supplying the period setting signal TEST.

The oscillation circuit 202 starts oscillation in response to the oscillation instruction signal START supplied thereto, and generates two clocks CK, CK/ and supplies them to the charge pump circuit 203.

The charge pump circuit 203 boosts a power supply voltage in response to the two clocks CK, CK/. Since the period setting signal TEST of "H" level is supplied to the switch 602 of the memory circuit 204, the memory circuit 204 is OFF.

The period setting signal TEST goes from "H" to "L" upon elapse of a given time (e.g., 200 µs). In synchronization with this, the flip-flop 705 of the voltage detecting circuit 205 latches the result of comparison by the voltage comparator circuit 704.

(1) The operation of the writing circuit in cases where the high voltage VPP does not reach a desired voltage value is described hereinafter with reference to FIG. 8.

Since the high voltage VPP of the charge pump circuit 203 does not reach the desired voltage value, namely, since the comparison voltage VPPF is not more than the reference voltage VBG, the voltage comparator circuit 704 outputs an "H" signal and the flip-flop 705 latches the "H" signal. Accordingly, the discrimination signal LVPP goes "H" while the discrimination signal DIS/ goes "L". The level of the discrimination signal LVPP is monitored by an external monitor outside the writing circuit 200, and the external monitor represents that the writing is normal or abnormal. When the discrimination signal LVPP is "H", the external monitor represents that the writing is abnormal.

On the other hand, since the discrimination signal DIS/ is "L", the AND gate 301 of the writing control circuit 201 generates an oscillation instruction signal START of "L" level. Since the oscillation instruction signal START is "L", the oscillation circuit 202 stops its oscillating operation and the charge pump circuit 203 stops its boosting operation. When the period setting signal TEST becomes "L", the switch 602 goes ON. However, since the high voltage VPP does not reach a desired voltage value, data is not written in the memory cell 601 of the memory circuit 204.

(2) The operation of the writing circuit in cases where the high voltage VPP reaches a desired voltage value is described hereinafter with reference to FIG. 9.

Since the high voltage VPP of the charge pump circuit 203 reaches the desired voltage value, namely, since the comparison voltage VPPF is not less than the reference voltage VBG, the voltage comparator circuit 704 outputs an "L" signal and the flip-flop 705 latches the "L" signal. Accordingly, the discrimination signal LVPP keeps "L" while the discrimination signal DIS/keeps "H". Since the discrimination signal LVPP is "L", an external monitor represents that the writing is not abnormal.

Meanwhile, since the discrimination signal DIS/ is "H", the AND gate 301 of the writing control circuit 201 generates an oscillation instruction signal START of "H" level. Since the oscillation instruction signal START is "H", the oscillation circuit 202 continues its oscillating operation and the charge pump circuit 203 continues its boosting operation. When the period setting signal TEST goes "L", the switch 602 goes ON. Since the high voltage VPP has reached a desired voltage value, data is written in the memory cell 601 of the memory circuit 204.

The semiconductor memory device having the writing circuit according to the first preferred embodiment of the invention has the following effects.

(1) In the semiconductor memory device having the writing circuit according to the first preferred embodiment of the invention, it is possible to monitor that the high voltage VPP reaches a desired voltage value or not by an external device outside the semiconductor memory device. Accordingly, it is not necessary to discriminate whether the high voltage VPP reaches a desired voltage value by confirming that data is written in the switch 602 or not.

(2) Further, in the semiconductor memory device having the writing circuit according to the first preferred embodiment of the invention, if the high voltage VPP does not reach a desired voltage value, it is possible not to write data in the memory circuit 204. Accordingly, erroneous writing in the memory circuit 204 can be prevented.

(3) Still further, in the semiconductor memory device having the writing circuit according to the first preferred embodiment of the invention, even in cases where any other third party lowers the high voltage VPP intentionally not to write data in the memory device, a reset operation or other measures can be taken by allowing the high voltage VPP to input to a reset input of a CPU (central processing unit).

Second Preferred Embodiment (FIGS. 10 to 13)

The invention will be described in further detail by way of example with reference to the accompanying drawings.

Figure 10:
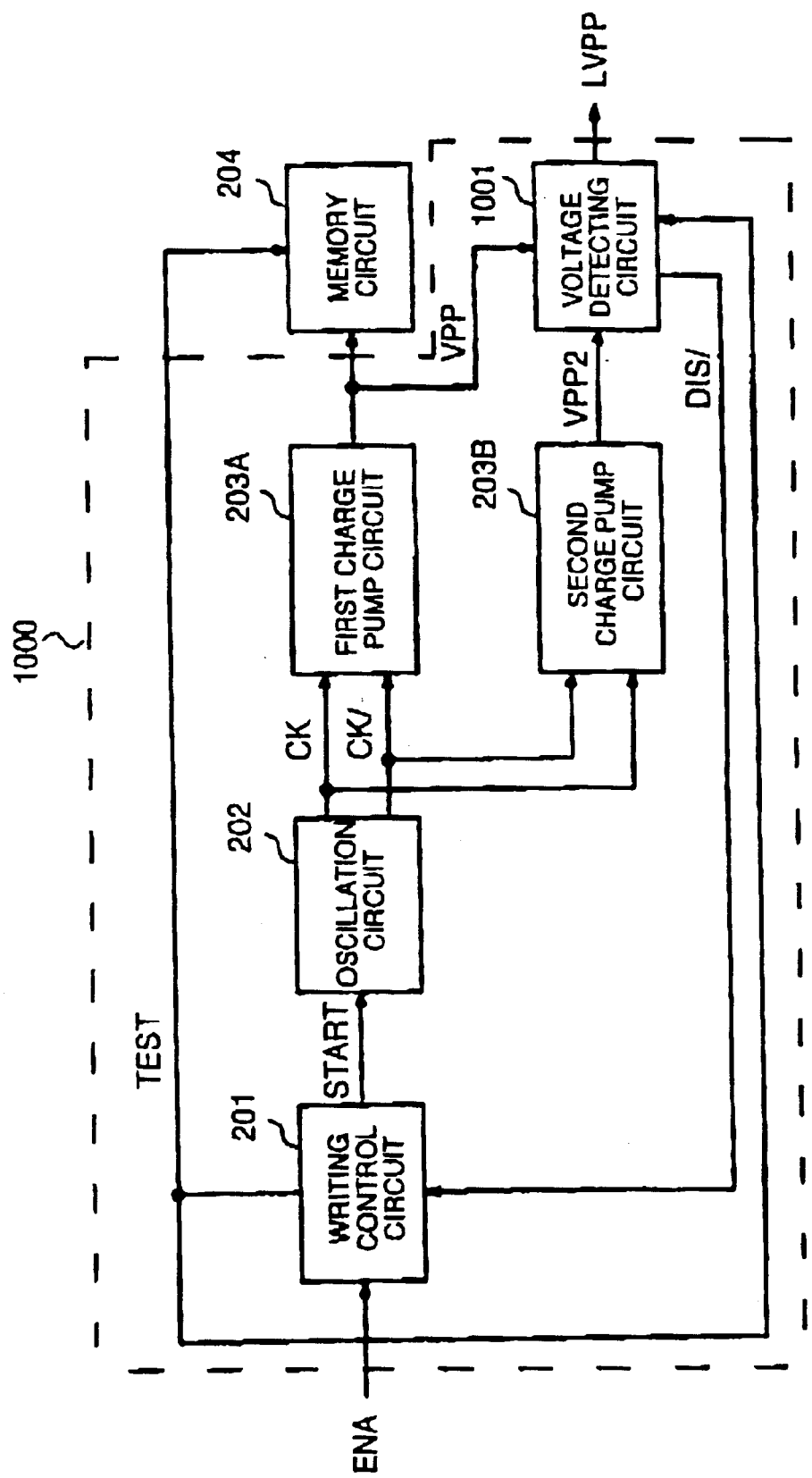
FIG. 10 is a block diagram of a semiconductor memory device having a writing circuit according to a second preferred embodiment of the invention.

FIG. 10 is a block diagram of a semiconductor memory device having a writing circuit according to a second preferred embodiment of the invention. The semiconductor memory device comprises a writing circuit 1000 and a memory circuit 204. The writing circuit 1000 comprises a writing control circuit 201, an oscillation circuit 202 connected to the output side of the writing control circuit 201, a first charge pump circuit 203A and a second charge pump circuit 203B respectively connected to the output side of the oscillation circuit 202, and a voltage detecting circuit 1001 connected to the output side of the first and second charge pump circuits 203A, 203B. The memory circuit 204 has a memory cell 601 and stores data in the memory cell 601 upon reception of a high voltage VPP outputted from the charge pump circuit 203.

The structure and function of each circuit of the semiconductor memory device are hereinafter described with reference to FIGS. 11 to 13.

The first and second charge pump circuits 203A, 203B have plural stages of pumps as shown in FIG. 10. The number of stages of pumps in the first charge pump circuit 203A and those of the second charge pump circuit 203B are different from each other. The charge pump circuits are different from each other in voltage value for boosting a power supply voltage depending on the number of stages of the pumps. For example, a value of a voltage to be boosted by the charge pump circuit having five stages of pumps is 12 volts. A value of a voltage to be boosted by the charge pump circuit having ten stages of pumps is 20 volts. The first charge pump circuit 203A is a circuit for boosting a voltage (high voltage VPP) necessary for effecting writing in the memory circuit 204. Since the memory circuit 204 requires 20 volts for effecting writing, the first charge pump circuit 203A has ten stages of pumps. Meanwhile, the second charge pump circuit 203B is a circuit for boosting a comparison voltage VPP2 for comparing with the high voltage VPP boosted by the first charge pump circuit 203A. The second charge pump circuit 203B has five stages of pumps.

Figure 11:
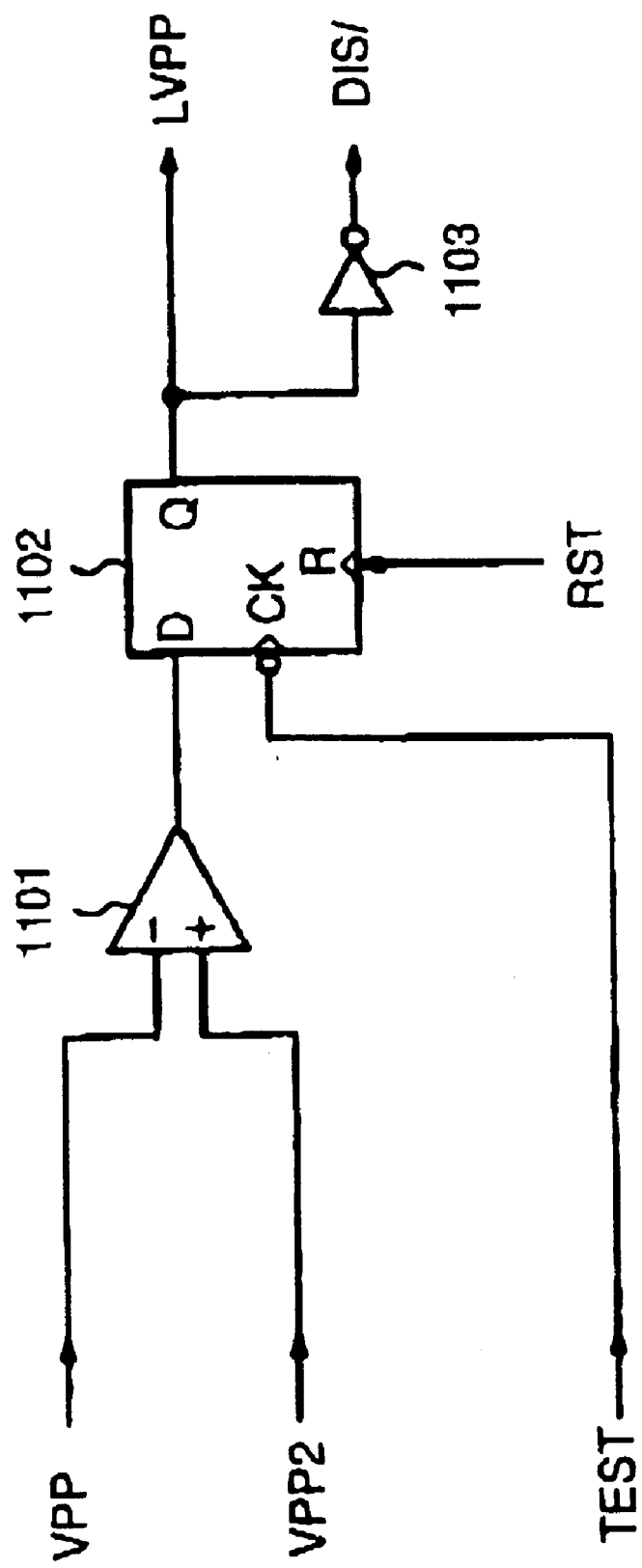
FIG. 11 is a circuit diagram of a voltage detecting circuit 1001 shown in FIG. 10.

FIG. 11 is a circuit diagram showing an example of the configuration of the voltage detecting circuit 1001 in FIG. 10.

The voltage detecting circuit 1001 comprises a voltage comparator circuit 1101 serving as a voltage comparison means composed of an operational amplifier or the like, a delay flip-flop 1102 serving as detection means and an inverter 1103.

The high voltage VPP applied from the first charge pump circuit 203A is inputted to an inverted input terminal (−) of the voltage comparator circuit 1101 while the comparison voltage VPP2 applied from the second charge pump circuit 203B is inputted to a non-inverted input terminal (+) of the voltage comparator circuit 1101. The output terminal of the voltage comparator circuit 1101 is connected to a data input terminal D of the flip-flop 1102. A period setting signal TEST is inputted from the writing control circuit 201 to a clock terminal CK of the flip-flop 1102. A reset signal RST is inputted from an external device to a reset terminal R of the flip-flop 1102. The inverter 1103 is connected to a data output terminal Q of the flip-flop 1102 through which a discrimination signal LVPP and a discrimination signal DIS/ that is the inverted signal of the discrimination signal LVPP are outputted in the same manner as the first preferred embodiment of the invention.

If the high voltage VPP is not less than the comparison voltage VPP2, the voltage comparator circuit 1101 outputs an "L" signal while it outputs a "H" signal in the opposite case. Accordingly, if the boosting operation is normally effected in the first charge pump circuit 203A and the high voltage VPP is not less than the comparison voltage VPP2, the voltage detecting circuit 1001 continues to output the discrimination signal LVPP of "L" level and the discrimination signal DIS/ of "H" level. Meanwhile, if the boosting operation is not effected normally by the first charge pump circuit 203A, and the high voltage VPP is the same as or not more than the comparison voltage VPP2, the voltage detecting circuit 1001 renders the discrimination signal LVPP "H" and the discrimination signal DIS/ "L" on the trailing edge of the period setting signal TEST.

Figure 12:
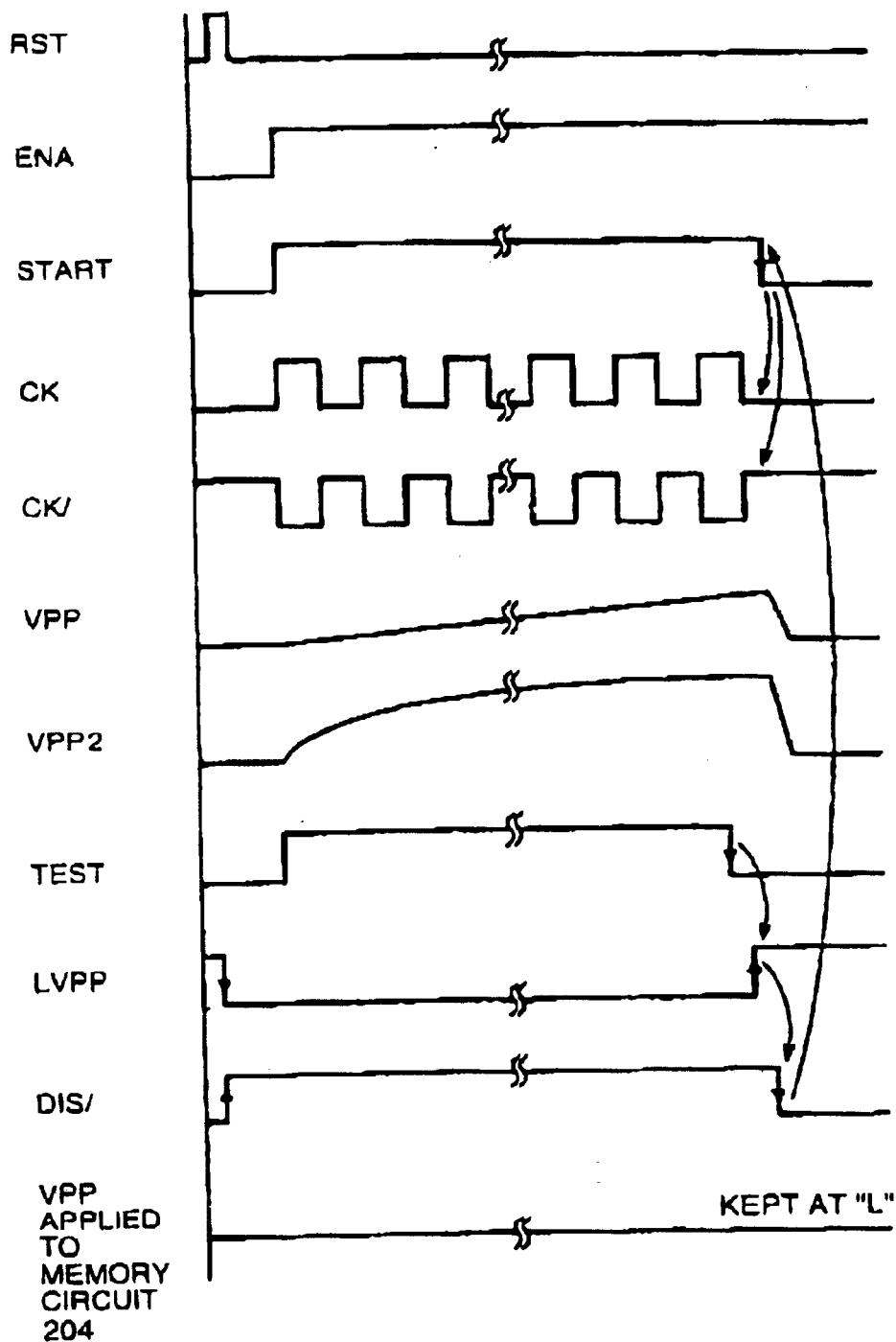
FIG. 12 is a timing chart showing the operation of the semiconductor memory device shown in FIG. 10 in cases where a high voltage VPP does not reach a desired voltage value.
Figure 13:
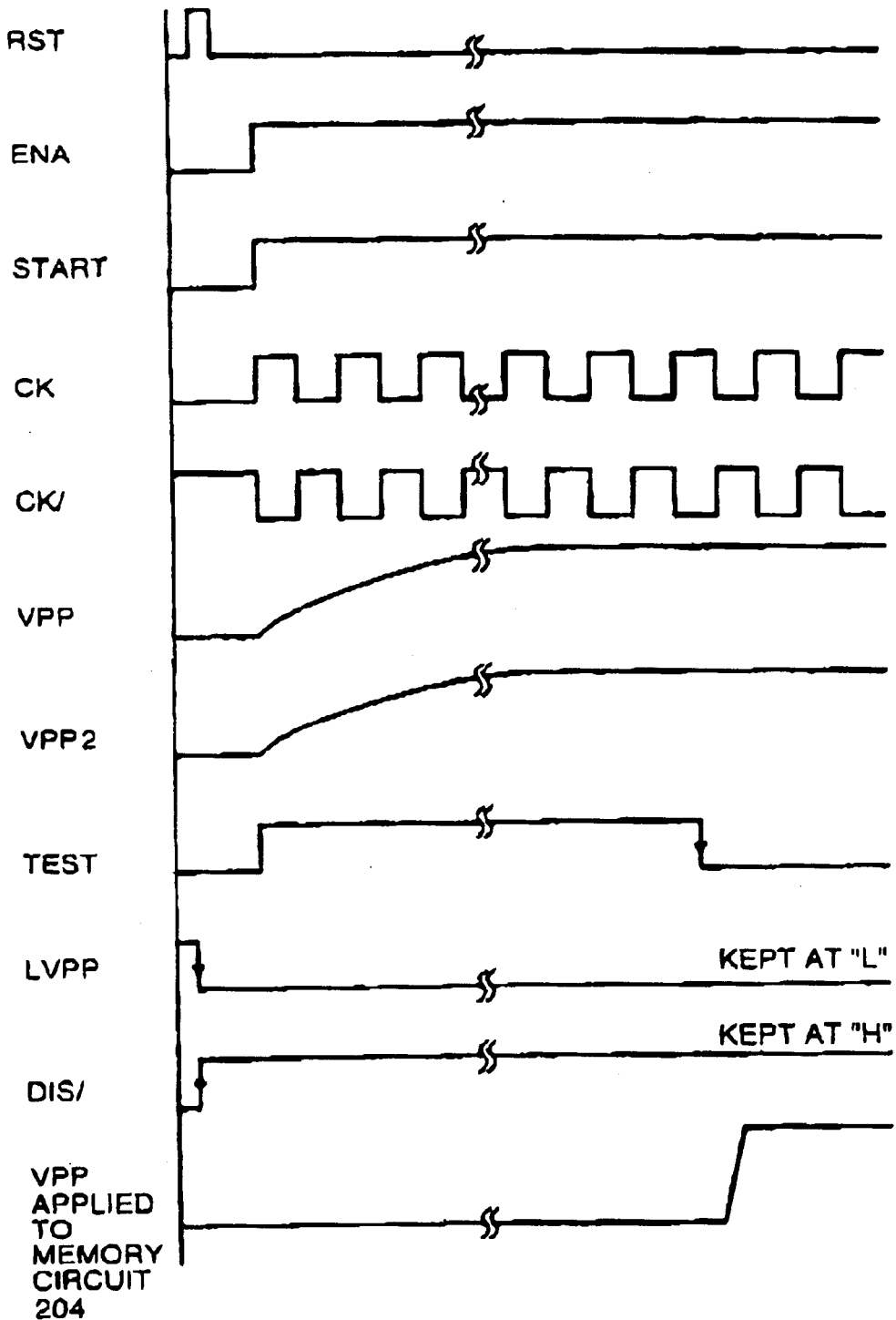
FIG. 13 a timing chart showing the operation of the semiconductor memory device shown in FIG. 10 in cases where a high voltage VPP reaches the desired voltage value.

FIGS. 12 and 13 are timing charts showing the operation of the semiconductor memory device having the writing circuit of the invention. The operation of the semiconductor memory device is described hereinafter with reference to these figures.

The flip-flop 1102 of the voltage detecting circuit 1001 effects a reset operation in response to a reset signal RST from the outside of the writing circuit 1000. That is, the flip-flop 1102 forcibly renders the discrimination signal LVPP "L" and the discrimination signal DIS/ "H" regardless of the level state held so far. The flip-flop 1102 supplies the discrimination signal LVPP to the outside of the writing circuit 1000 and the discrimination signal DIS/ to the writing control circuit 201.

At this time, when the start signal ENA representing the start of writing ( "H" level) is inputted to the writing control circuit 201, the writing control circuit 201 renders the period setting signal TEST "H" for a given period (e.g., 200 $\mu s$). The writing control circuit 201 supplies the period setting signal TEST to the memory circuit 204 and voltage detecting circuit 1001. The period setting signal TEST is a one pulse signal. The writing control circuit 201 renders the oscillation instruction signal START "H" and supplied it to the oscillation circuit 202 while supplying the period setting signal TEST.

The oscillation circuit 202 starts oscillating operation in response to the oscillation instruction signal START supplied thereto, and generates two clocks CK, CK/ and supplies them to the first and second charge pump circuits 203A, 203B.

The first and second charge pump circuits 203A, 203B boost a power supply voltage respectively in response to the two clocks CK, CK/. The charge pump circuit 203A generates the high voltage VPP while the charge pump circuit 203B generates the comparison voltage VPP2. Since the period setting signal TEST of "H" level is supplied to the switch 602 of the memory circuit 204, the memory circuit 204 is OFF.

The period setting signal TEST goes from "H" to "L" upon elapse of a given time (e.g., 200 μs). In synchronization with this, the flip-flop 1102 of the voltage detecting circuit 1001 latches the result of comparison by the voltage comparator circuit 1101.

(1) The operation of the writing circuit in cases where the high voltage VPP does not reach a desired voltage value (when the high voltage VPP is not more than the comparison voltage VPP2) is described hereinafter with reference to FIG. 12.

Suppose that the first charge pump circuit 203A can not increase the high voltage VPP to a given voltage value due to some causes (e.g., 10 volts). On the other hand, suppose that the second charge pump circuit 203B can increase the comparison voltage VPP2 to a desired voltage value (e.g., 12 volts). The voltage comparator circuit 1101 compares the high voltage VPP with comparison voltage VPP2 and applies the result of comparison ("H" signal) to the flip-flop 1102. The flip-flop 1102 latches the result of comparison therein in synchronization with the trailing edge of the period setting signal TEST. Then, the flip-flop 1102 renders the discrimination signal LVPP "H" and the discrimination signal DIS/ "L". Whereupon, the level of the discrimination signal LVPP is monitored by an external monitor outside the writing circuit 1000, and the external monitor represents that the writing is normal or abnormal. When the discrimination, signal LVPP is "H", the external monitor represents that the writing is abnormal.

On the other hand, since the discrimination signal DIS/ is "L", the AND gate 301 of the writing control circuit 201 generates an oscillation instruction signal START of "L" level. Since the oscillation instruction signal START is "L", the oscillation circuit 202 stops its oscillating operation and the first and second charge pump circuits 203A, 203B stop their boosting operation. When the period setting signal TEST becomes "L", the switch 602 goes ON. However, since the high voltage VPP has not reached a desired voltage value, data is not written in the memory cell 601 of the memory circuit 204.

(2) The operation of the writing circuit in cases where the high voltage VPP reaches a desired voltage value (when the high voltage VPP is not less than the comparison voltage VPP2) is described hereinafter with reference to FIG. 13.

Suppose that the first and second charge pump circuits 203A, 203B increased the high voltage VPP to a desired voltage value (e.g., 12 volts). The voltage comparator circuit 1101 compares the high voltage VPP with the comparison voltage VPP2 and supplies the result of comparison ( "L" signal) to the flip-flop 1102. The flip-flop 1102 latches therein the result of comparison in synchronization with the trailing edge of the period setting signal TEST. The flip-flop 1102 renders and keeps the discrimination signal LVPP "L" and the discrimination signal DIS/ "H". Since the discrimination signal LVPP is "L", an external monitor represents that the writing is not abnormal.

Meanwhile, since the discrimination signal DIS/ is "H", the AND gate 301 of the writing control circuit 201 generates an oscillation instruction signal START of "H" level. Since the oscillation instruction signal START is "H", the oscillation circuit 202 continues its oscillating operation and the first and second charge pump circuits 203A, 203B continue their boosting operations. When the period setting signal TEST goes "L", the switch 602 goes ON. Since the high voltage VPP has reached a desired voltage value, data is written in the memory cell 601 of the memory circuit 204.

The semiconductor memory device having the writing circuit according to the second preferred embodiment of the invention has the following effect in addition to the foregoing first to third effects obtained by the semiconductor memory device having the writing circuit according to the first preferred embodiment of the invention.

(4) The semiconductor memory device having the writing circuit according to the second preferred embodiment of the invention has a second charge pump instead of the reference voltage generation circuit 701 of the writing circuit of the first preferred embodiment. Accordingly, it is possible to easily design and structure the writing circuit of the semiconductor memory device having the writing circuit according to the second preferred embodiment.

The invention is not limited to the foregoing first and second preferred embodiments but it can be modified variously. For example, the writing circuit is adapted for a semiconductor memory device having the memory circuit 204 made up of a nonvolatile memory in which data is written by the application of high voltage VPP. However, the writing circuit can be applied to a semiconductor memory device having other elements requiring a high voltage VPP. Even in this case, an unnecessary high voltage VPP is not applied to such elements, with the effect of preventing an erroneous operation.

What is claimed is:

1. A writing circuit comprising:
 a writing control circuit for outputting an oscillation instruction signal for instructing a start of oscillation in response to an external signal, and a period setting signal for setting a time after the start of oscillation at which a first boosted voltage is compared to a second boosted voltage;
 an oscillation circuit for effecting an oscillating operation in response to the oscillation instruction signal so as to output clock signals;
 a first charge pump circuit for boosting a power supply voltage in response to the clock signals so as to generate the first boosted voltage;
 a second charge pump circuit for boosting the power supply voltage in response to the clock signals to generate the second boosted voltage;
 a voltage detecting circuit for comparing the first boosted voltage with the second boosted voltage so as to determine if the first boosted voltage reaches a desired voltage value and for outputting discrimination signals for instructing the oscillation circuit to stop the oscillating operation if the desired voltage value is not reached.

* * * * *